US009389252B2

(12) United States Patent
Nys et al.

(10) Patent No.: US 9,389,252 B2
(45) Date of Patent: Jul. 12, 2016

(54) SAMPLING CIRCUITRY AND SAMPLING METHOD FOR A PLURALITY OF ELECTRODES

(71) Applicant: Semtech Corporation, Camarillo, CA (US)

(72) Inventors: Olivier Nys, Neuchatel (CH); Pascal Monney, San Diego, CA (US)

(73) Assignee: Semtech Corporation, Camarillo, CA (US)

(*) Notice: Subject to any disclaimer, the term of this patent is extended or adjusted under 35 U.S.C. 154(b) by 0 days.

(21) Appl. No.: 14/755,850

(22) Filed: Jun. 30, 2015

(65) Prior Publication Data
US 2016/0018447 A1    Jan. 21, 2016

Related U.S. Application Data

(60) Provisional application No. 62/025,698, filed on Jul. 17, 2014.

(51) Int. Cl.
*G01R 13/14* (2006.01)
*G01R 19/25* (2006.01)
(Continued)

(52) U.S. Cl.
CPC ............. *G01R 19/25* (2013.01); *G01R 19/10* (2013.01); *G01R 19/252* (2013.01); *H03M 3/414* (2013.01); *H03M 3/466* (2013.01)

(58) Field of Classification Search
CPC ............ G01R 13/345; G01R 13/0272; G01R 31/3177
USPC ................... 324/76.24, 76.11, 76.12, 76.19
See application file for complete search history.

(56) References Cited

U.S. PATENT DOCUMENTS 6,011,502 A * 1/2000 Kao ................. H03M 1/147
341/154
6,028,545 A * 2/2000 Chen ................ H03M 1/144
341/156
(Continued)

FOREIGN PATENT DOCUMENTS

FR        2756048      5/1998
WO   WO-2012034714 A1  3/2012

OTHER PUBLICATIONS

European Search Report for EP Application No. 15172351.7, dated Nov. 26, 2015, 8 pages.
(Continued)

*Primary Examiner* — Tung X Nguyen
*Assistant Examiner* — Giovanni Astacio-Oquendo
(74) *Attorney, Agent, or Firm* — Blank Rome LLP

(57) ABSTRACT

A sampling circuitry for a plurality of electrodes the circuitry comprising a plurality of charge amplifiers and a plurality of modulators, wherein each charge amplifier and each modulator, comprised in the plurality of charge amplifiers and the plurality of modulators, respectively, corresponds to an electrode of the plurality of electrodes, wherein each modulator is capable of generating a residue signal and a rough code corresponding to each sampled electrode of the plurality of electrodes, a multiplexer capable of receiving a plurality of residue signals generated by the plurality of modulators, a residue analog to digital converter capable of receiving a multiplexed residue signal from the multiplexer and outputting a digitized multiplexed residue signal, and a digital summation circuitry capable of receiving the digitized multiplexed residue signal and a plurality of rough codes, comprising each rough code corresponding to each sample electrode, and outputting a plurality of output codes.

14 Claims, 9 Drawing Sheets

(51) Int. Cl.
*G01R 19/10* (2006.01)
*G01R 19/252* (2006.01)
*H03M 3/00* (2006.01)

(56) References Cited

U.S. PATENT DOCUMENTS 6,445,329 B1 * 9/2002 Abassi .................. H03M 1/145
　　　　　　　　　　　　　　　　　　　331/17

2012/0217981 A1 8/2012 Erdogan et al.

OTHER PUBLICATIONS

P. Carbone, et al., "Design, Modeling and Testing of Data Converters", ProQuest, http://extras.springer.com/, Nov. 2015, pp. 150-159.

* cited by examiner

SAMPLING CIRCUITRY AND SAMPLING METHOD FOR A PLURALITY OF ELECTRODES

REFERENCE DATA

The present application claims priority from U.S. provisional patent application 62/025,698 of Jul. 17, 2014 in the name of Semtech Corporation, Camarillo, Calif., the contents whereof are hereby incorporated by reference in their entirety.

FIELD OF THE INVENTION

The present invention relates to a sampling circuitry for a plurality of electrodes, and a corresponding method for performing sampling of a plurality of electrodes. More specifically, the present invention concerns techniques for measurement of grounded capacitors, as typically used for proximity detection.

DESCRIPTION OF RELATED ART

Various techniques are available in the art for the measurement of grounded capacitors, while said capacitors are used for proximity detection.

One known technique is described herewith in connection with FIG. 1. FIG. 1 illustrates a known technique for measuring a grounded capacitor Cin that is employed in touch-sensitive panels and proximity detectors. The technique consists of varying the voltage of the capacitive electrode and detecting the corresponding charge variation across Cin. This is achieved by tying the capacitive electrode to the negative input (virtual ground) of a charge amplifier with a capacitor Cfb in feedback. The voltage variation on the input capacitor is achieved by applying a well-defined voltage variation on the positive input of the amplifier, as the negative input will track the positive one by feedback. Since the current across capacitor Cin may only flow towards Cfb (the amplifier having high impedance inputs), the charge variation across Cin (and thus the value itself of Cin) may be measured by measuring the voltage variation across feedback capacitor Cfb. This voltage variation can be measured directly in the analogue domain, processed, or converted into the digital domain. The circuit illustrated in FIG. 1 comprises, apart from the elements already mentioned, as well the readout circuit 120, an input capacitor to be detected 20, and a variable voltage source 80. In the present document, the variable voltage source 80 may be identified also as excitation voltage source 80, or varying voltage source 80, with the enumerated terms having the same meaning.

A drawback of this technique is its extreme sensitivity to any parasitic capacitor Cpar that might be connected between electrode input node and ground, and in particular to parasitic capacitors related to input pads, protections and parasitic capacitors of input amplifier, or parasitic capacitors to supply voltages. Indeed, these parasitic capacitors may not be distinguished from the capacitor to be measured and thus affect the measurement result.

Patent FR 2 756 048 describes techniques for measurement of a grounded capacitor, as typically used for proximity detection. The advantage of these techniques lies in their precision and in that they are quite insensitive to parasitic capacitors. This is achieved by varying with respect to ground not only the voltage of the capacitive electrode but all the voltages of the measuring circuitry. All the voltages vary in the same way as the voltage of the capacitive electrode such that the voltage across the parasitic capacitors does not change. To this end, all the input circuit or charge amplifier is referred to a local reference potential, also named a local ground (typically the substrate of the measurement circuit), which is caused to vary with respect to the global ground by some excitation circuit, such the voltage source that generates the varying voltage Vin. This technique is illustrated in connection with FIG. 2. As it may be seen from the figure, the local ground (floating voltage VF) is thus floated with respect to the global (external) ground. The readout circuit is supplied by floating positive and negative supplies that are referenced to local ground. From measurement circuit point of view, "only" the external ground voltage is changing, all the internal circuitry being referred to floating voltage. Hence the measurement is insensitive to parasitic internal capacitors. The circuit illustrated in FIG. 2 comprises in addition to the elements already mentioned above and in connection with FIG. 1, a floating domain 170 and a floating supply and ground 175.

As already pointed out, the purpose of the circuits described above in connection with FIGS. 1 and 2 is to suppress the sensitivity of the measurement circuitry to all parasitic capacitors between the capacitive electrode (the node corresponding to virtual ground of amplifier) and the external ground, by referring all the circuitry to the internal ground or floating ground (VF).

The capacitor Cin to be measured may be far from the measurement circuitry, so any parasitic capacitor between the wire connecting Cin to measurement circuit and global (external) ground would be added to the measured capacitor. To avoid this error, the wire connecting Cin to the measurement circuitry may be uncoupled from the external ground by using a guard electrode. This guard electrode must then be connected to the internal or floating ground VF or to a node biased at a constant voltage with respect to VF, such that the capacitor between capacitive electrode and guard remains biased at a constant voltage and does not affect the measurement result. For this reason, the measurement circuitry may have a guard output tied to internal ground VF or biased at a constant voltage with respect to it, and the guard of the wire between the capacitor and the measurement circuit should be tied to this output of the measurement circuit, as illustrated in FIG. 3. The circuit illustrated in FIG. 3 comprises in addition to the elements already mentioned above and in connection with FIGS. 1 and 2, a guard 30 and the floating voltage VF is indicated with numeral 85.

In display and touch screen applications, typical for smartphones or tablets, the capacitive electrodes are placed on top of an LCD display and the capacitances to be measured are between these top electrodes and external ground, passing through the finger approaching the screen.

However, only the capacitance on the upper side, with respect to the finger, is of interest, while the capacitance with respect to LCD and parasitic signals from LCD is not useful to detect finger's proximity. The activity of the LCD is liable to inject unwanted charges in the readout circuit through the parasitic capacitors, which could falsify the output of the proximity detector. For this reason, a conducting guard layer is inserted between the capacitive electrodes and the LCD display. This conducting guard layer should also be tied to the guard output of the measurement circuitry, as for the guard of the wires between touch screen and measurement circuitry.

Such a measurement arrangement is illustrated in connection with FIG. 4 in which a LCD panel 200 is overlaid by a transparent guard electrode 30, above which are placed a plurality of conductive transparent pixels 25 that are connected to a plurality of Capacity-to Digital Converters (CDC) 127 included in a readout circuit 120. Each CDC 127 includes a charge amplifier. Since the guard electrode 30 can be regarded as an equipotential surface, it provides an effective electrostatic screen, and unwanted interferences that may come from the LCD 200 are effectively screened out by the guard potential and do not reach the CDC stages 127. A plurality of parasitic coupling capacitances 210 may be present between the display 200 and the guard 30. Further, guard capacitances 212 and capacitive electrodes 25 may as well be present between guard 30 and the measurement circuit 120.

As discussed above, the readout circuit includes a variable voltage source 80 that generates a reference potential 85 that is connected to the guard potential 30 and to the non-inverting inputs of the charge amplifiers of the CDC. In this configuration, the CDC stages have low-impedance virtual ground inputs, and the pixel or capacitive electrodes 25 are essentially held at the potential 85 of the guard electrode 30. The amplitude of the signal at the outputs Vout_1, Vout_2, Vout_N is proportional to the respective capacities towards ground $Cin\_1, Cin\_2, \ldots, Cin\_N$, seen by the electrodes 25. Importantly, the voltage across parasitic capacitors 212, the guard capacitances, which are connected between the guard electrode 30 and the pixels 25 is constant, hence these parasitic elements do not contribute to the readout.

The circuit 120 for measuring the external grounded capacitor thus includes several building blocks, as represented in FIG. 5:

- The excitation voltage source 80, used to generate the floating voltage or the floating node VF, or local ground, that is variable with respect to the global or external ground;
- The acquisition circuitry for measuring the charge variation across the capacitor to be measured, and produce a signal or, preferably, a digital code that represents this capacity. Dependent on the number of capacitive input pixels this circuitry may include a plurality of independent capacity-to-digital converters 130, each referred to floating ground VF. The converters 130 may comprise a charge amplifier 126 (amplifier with feedback capacitor tied between output and negative input, and with positive input tied to the floating voltage VF (local ground) and eventually other circuitry for post processing, such as analogue to digital converters 128, filters, amplifiers, attenuators, or input multiplexers 127;
- Generation of the supply voltages (V+, V−): since the converters 130 are referred to the floating ground, their active elements should, preferably, be supplied with voltage sources that are referenced to the floating ground rather than to the external ground. The floating supply unit 175 produces the required supply, from an external voltage supply Vdd, referred to external ground. The floating supply 175 may include inductive transformers, DC/DC converters of the boost or buck variety, switched-capacitor circuits, or any other voltage conversion scheme;
- Generation of control and clock signals 182: many functions of the acquisition circuits need to be synchronised with the modulation signal applied between external ground and internal or floating ground. In particular, the detection of the charge must be perfectly synchronous with the modulation signal. Moreover, data coming from the acquisition units 130 needs to be transmitted outside the floating voltage domain.

In many applications, and particularly where touch screen and proximity detections are concerned, a large number of capacitors must be measured simultaneously or successively. The measurement circuitry may then also include several acquisition chains or acquisition circuitry in parallel with 130 for measuring a large number of capacitors. A multiplexer 127 may be added in front of each measurement circuitry in order to address successively different input electrodes, one after the other, as illustrated as well in FIG. 5. The multiplexers in front of the acquisition chains allow addressing several inputs in succession by each acquisition chain, thereby reducing the number of acquisition chains to implement on a chip. Also, when a large number of electrodes have to be monitored, several chips similar to the measurement circuitry of FIG. 5 may be operated, either in parallel or successively, one after the other.

There is however a physical limit to the number of capacitive inputs that can be addressed by a single chip. For practical reasons there is a minimum pitch between two consecutive input pads, and the physical size of the chip cannot exceed certain limits determined by the nature of the process used, thermal expansion, and other constraints. When the number of capacitive cells on the display exceeds the number of inputs that can be tied to a single chip, several chips must be used to address them all.

Therefore, improved methods and corresponding circuitry, are needed for the measurement of grounded capacitors, especially improved capacitive sensing interfaces are needed for proximity detection with charge amplification, sigma delta conversion and multiplexed residue quantization.

BRIEF SUMMARY OF THE INVENTION

According to the present invention, these aims are achieved by means and methods that make the object of the appended claims.

BRIEF DESCRIPTION OF THE DRAWINGS

The invention will be better understood with the aid of the description of embodiments given by way of example and illustrated by the following figures, in which:

FIGS. 1 to 3 show, schematically, known circuits used in capacity measurement, such as:

FIG. 1 illustrates a known technique for measuring a grounded capacitor Cin, that is employed in touch-sensitive panels and proximity detectors;

FIG. 2 illustrates a known technique for measurement of grounded capacitors which is insensitive to parasitic capacitors;

FIG. 3 illustrates another known circuitry employed by a technique for the measurement of grounded capacitors, the circuit uses an active guard to minimize parasitic capacitive couplings;

Figure 1:
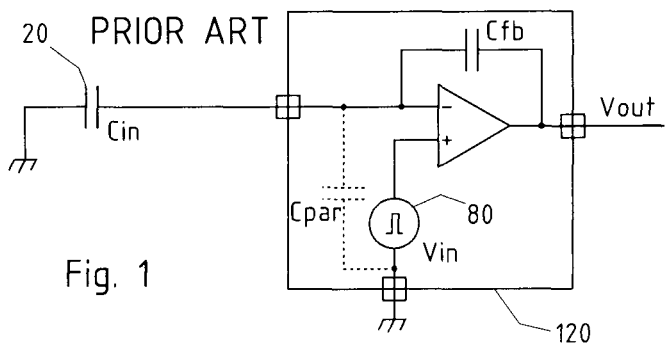
Figure 2:
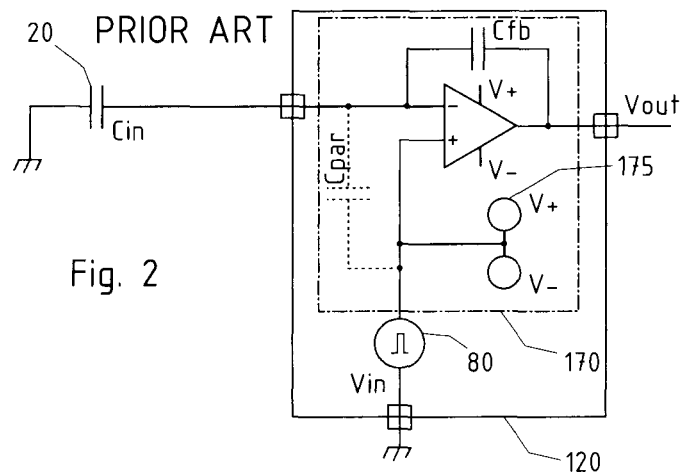
Figure 3:
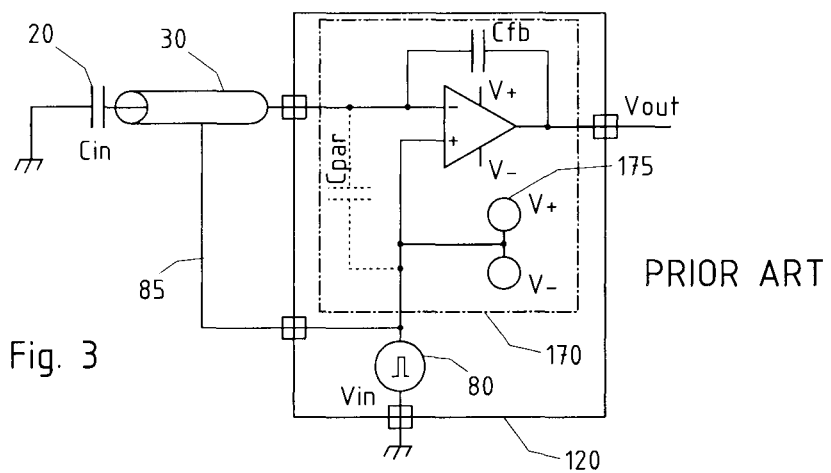
Figure 4:
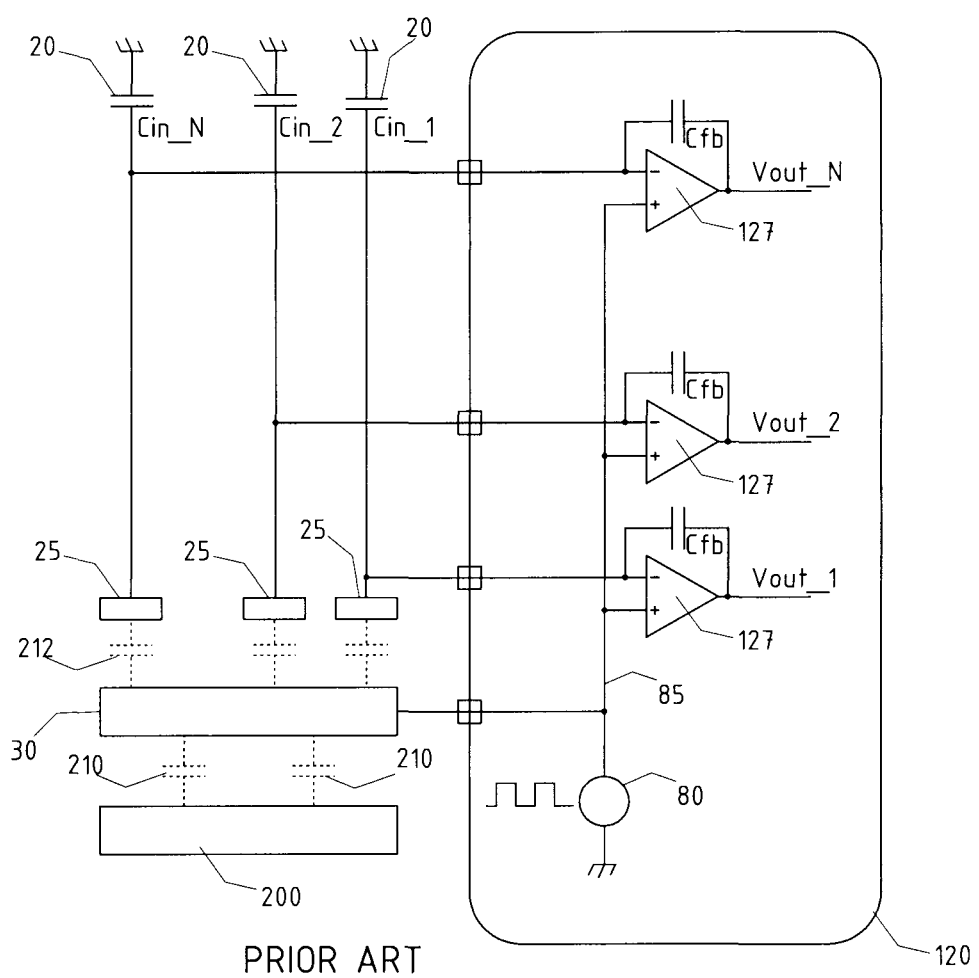
FIG. 4 illustrates yet another known circuitry employed by a technique for the measurement of s plurality of capacitors such as those employed in touch screens.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION OF POSSIBLE EMBODIMENTS OF THE INVENTION

The following description is not to be taken in a limiting sense, but is made merely for the purpose of describing the general principles of exemplary embodiments. The scope of the invention should be determined with reference to the claims.

Figure 6:
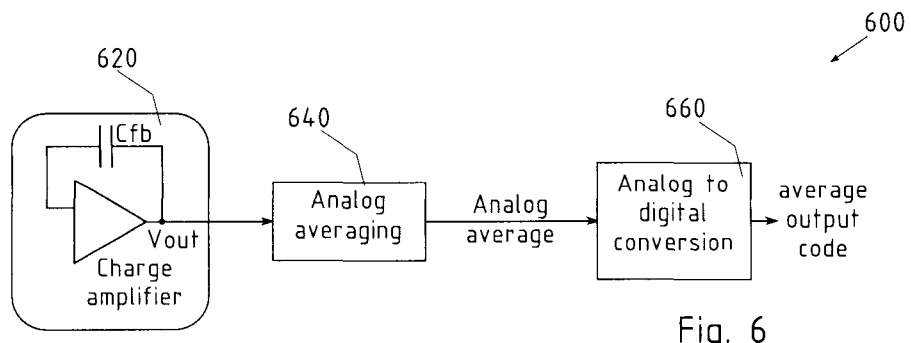
FIGS. 6 and 7 are block representations of digital averaging, of analogue signals or, respectively, of digital ones.
Figure 7:
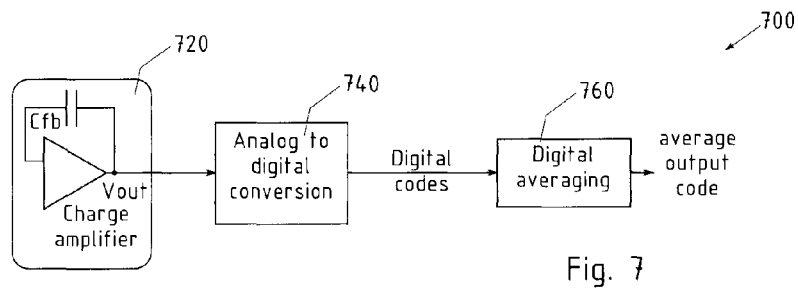

In the following of this document, acquisition chains will be described. It must be understood that an acquisition chain is a circuit, or part of a circuit, arranged for measuring a capacity seen from one input electrode, and provide a suitable output representative of such capacity. The output may be a digital representation of the measured capacity, and in this important case, the acquisition chain may include one or several Charge-to-Digital Converters (CDC). Often, the number of touch-sensitive pixels being large, individual acquisition chain include a multiplexing device so as to measure the capacity of several input electrodes in succession and in an interleaved fashion. Referring to the exemplary realization of FIGS. 6 to 12, the first block of the acquisition chain after the optional input multiplexer is the charge amplifier. This block is exemplarily illustrated in FIGS. 6 and 7 as blocks 620 and 720. Exemplarily, the charge amplifier may comprise, as illustrated in FIGS. 6 and 7 a feedback capacitor, as the Cfb capacitor illustrated in FIG. 1, and an amplifier.

The output of the charge amplifier, exemplarily 620 and 720, experiments a voltage variation which is synchronous and proportional to the voltage variation applied to the floating ground node (floating voltage VF or guard voltage). The output voltage variation of the charge amplifier is also proportional to the input capacitance to be detected, and is thus the signal of interest. The purpose of the A/D is thus precisely to measure the output voltage variation of the charge amplifier. This output voltage variation of the charge amplifier should be measured in the floating supply domain, thus with respect to the floating ground (guard, V+, or V−).

For instance if a sinusoidal signal is applied on the floating ground, then the peak to peak amplitude of the sinusoidal signal at the output of the charge amplifier should be measured and quantized. This can be done by classical demodulation schemes, for instance by multiplying the output signal by the sinusoidal input signal and low pass filtering in order to eliminate the harmonics.

If a square wave signal is applied on the floating ground, then the amplitude of the square wave output signal of the charge amplifier should be measured and quantized, which means quantifying the amplitude of the rising and falling edges. The rising and falling edges can be quantized separately, or summed up in the analog domain and quantized, different options are possible.

However, irrespective what the method for converting the input capacitor into a voltage variation of output voltage of the charge amplifier is used, this measurement will be polluted by several noise sources, in particular: thermal noise of the circuit, basically due to resistors (4 kTR noise), MOS transistors of amplifiers (4 kT/gm noise), and switches (leading to kT/C noise). This is wide band noise with approximately flat noise spectral density (white noise). Measurement can also be polluted by other external noise sources, such as interferers, parasitic signals coupling to the electrodes, for instance due to 50/60 Hz power network, parasitic signals due to battery chargers, and others.

The most efficient way to attenuate these perturbations is to repeat a large number of times the measurement and to average the results in order to filter out the perturbing signals. The averaging can be a direct (un-weighted) averaging (sum of the samples divided by number of samples), or a weighted averaging (different samples having different weights when averaging). In any case, this averaging corresponds to a low-pass filtering. In order to reduce the filter bandwidth and thus to eliminate most of perturbations, it is desirable to average the measurement over a large number of cycles of the modulation signal (signal modulating the floating ground). The bandwidth is then indeed inversely proportional to the number of averaged modulation cycles. However, the overall duration of the measurement is basically the number of modulation cycles times the period of the modulation cycle. Thus the bandwidth is thus inversely proportional to the overall measurement time. There is thus a clear trade-off between the conversion rate or frame rate on one side, and the rejection of external perturbation outside a narrow band on the other side.

The averaging of the variation of the output signal of the charge amplifier over the different modulation cycles can be done in different ways.

The first solution consists into performing the averaging in the analog domain, and it is illustrated with the aid of the block diagram illustrated in FIG. 6. As shown in FIG. 6 a charge amplifier 620 outputs a signal that is subjected via block 640 to analog averaging, and the analog average so obtained is fed into a block 660 capable of performing analog to digital conversion. The output of block 660 is an average output code.

A drawback of performing the averaging on a narrow bandwidth with an analog low pass filter is that it requires large capacitors and resistors, and thus a large area. Another drawback is that it requires a high resolution analog to digital converter, also leading to a large area.

Alternatively the averaging of the signal may be performed in the digital domain. FIG. 7 illustrates a block representation of digital averaging.

One advantage of employing digital averaging/filtering techniques is that they can be realized quite efficiently, with low silicon area. However, a high resolution ADC is still required. While referring to FIG. 7 it is apparent that digital averaging comprises a charge amplifier 720 outputting a signal that is subjected to analog to digital converter via the circuitry of block 740. Digital codes are outputted by the ADC 740 that are subjected to digital averaging in accordance with the capabilities of block 760. The output of block 760 is an average output code.

Figure 8:
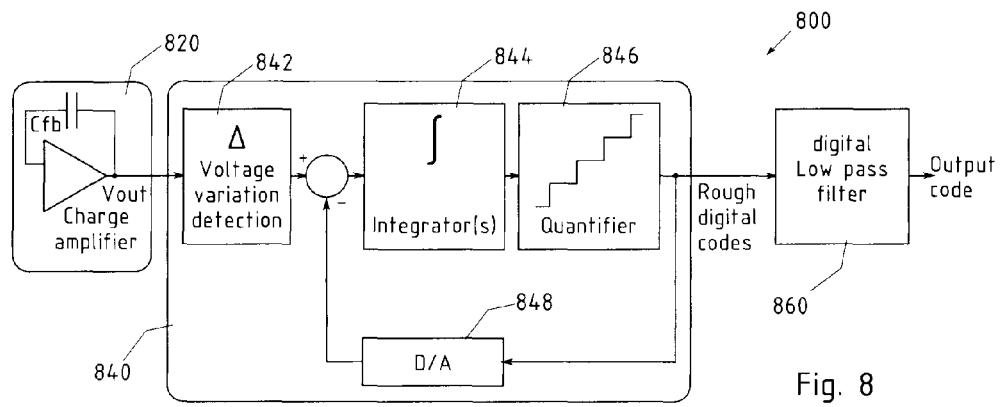
FIG. 8 illustrates the implementation of the acquisition chain with a sigma delta modulator.

A third solution for averaging the variation of the output signal of the charge amplifier is to use a sigma delta or incremental ADC converter in order to perform the analog to digital conversion. In FIG. 8 a block diagram of such a converter is illustrated.

In accordance with the representation made in FIG. 8, a sigma delta converter 800 comprises a charge amplifier 820, a sigma delta modulator 840 that may be a first order sigma delta modulator, and a digital low pass filter 860. The sigma delta modulator comprises a voltage variation detection block 842, an integrator 844, a quantifier 846 and a digital to analog converter 848.

The sigma delta converter 800 has the ability to achieve a high resolution with a relatively low silicon area. This type of converter simultaneously performs the averaging, within the digital filter. The solution illustrated in FIG. 8 is for a first order sigma delta modulator, though higher order sigma delta modulators are also possible. The variation of the charge amplifier 820 at each modulation cycle, such as the peak to peak amplitude or the voltage edges, is first extracted by the block labelled 842, the Δ or the voltage variation detection block. The output of block 842 is then integrated, typically by a switched capacitor integrator 844 operating also at the modulation frequency, though other types of integrators 844 are possible. The output of this integrator 844 is then converted by a coarse quantifier 846, implemented as comparator or bank of comparators, into small digital codes (1 bit or a very limited number of bits) produced at the same rate as the modulation rate. These codes are then converted back into analogue via block 848 and subtracted from the input signal corresponding to the charge amplifier output voltage variations (output of Δ block). Due to the feedback loop to the input of the integrator 844, the output code is forced to match the input signal, at least for low frequencies. This means that at low frequencies the output code of the sigma delta loop is a good representation of the charge amplifier output voltage variation. Thus by filtering or by averaging the output code from the sigma delta loop, (averaging being in fact a particular case of filtering) what is obtained is a digital output code which is representative of the averaged (or low pass filtered) value of the charge amplifier output voltage variation, and thus of the input capacitor. The averaging and ADC conversion are thus performed simultaneously.

An advantage of this approach is that it does not require very large capacitors in order to accumulate the signal corresponding to the charge amplifier output voltage variation. Indeed, as soon as the accumulated signal exceeds a given level, a quantity corresponding to the output code is subtracted by the feedback path. By this fact, a limited amount of signal is accumulated even after a large number of samples, as the feedback loop manages to avoid saturation of the integrator. Thus this accumulation does not require huge capacitors and silicon area.

Another advantage is that the approach is able to achieve a very high resolution with a very coarse quantifier, at the extreme with a simple comparator producing one bit at a time. Indeed, for instance by cumulating the output bit on 65536 cycles, it is possible to obtain a 16-bit resolution output code. No high precision is required for the quantifier, as the errors are compensated by the feedback loop.

However, practically, the number of modulation cycles that can be averaged for the measurement is limited. Indeed, this number is the ratio of the total time available for the measurement over the modulation period. The time available for the measurement is limited by the frame rate at which the electrodes must be scanned, and this time is inversely proportional to the number of electrodes to be scanned successively during one frame. On the other hand the modulation frequency is limited by practical reasons related to R-C time constants on the circuit or the display, current consumption, speed at which different circuits can be operated. This limitation of the number of modulation cycles that can be averaged may also limit the resolution that can be obtained from a sigma delta ADC converter, as given in FIG. 8. In order to increase the resolution with a limited number of modulation cycles, different solutions are possible.

The first one is to increase the order of the sigma delta modulator. However this strongly increases the complexity. In particular, a higher order digital filter would be required, with more complexity and more latency.

The second solution is to increase the resolution of the coarse quantifier, and correspondingly the one of the DAC in the feedback path. However, each supplementary resolution bits of the quantifier and of the DAC basically requires to double the number of elements (comparators, elements of the DAC), so that the complexity then increases exponentially.

A third solution is to periodically quantify by means of an ADC the output of the integrator of the sigma delta. Indeed this integrator accumulates the difference between the input signal and the output signal. Thus the integrator output increases if the output signal underestimates the input signal and decreases if it overestimates it. Thus by quantifying the variation of the integrator, it is possible to refine the estimation. In the particular case of the first order sigma delta modulator of FIG. 8, the digital filter can be realized by simply calculating the sum (or un-weighted averaging) of the output code from the coarse quantifier over a given number N of consecutive modulation cycles. In such a case, the difference of the output voltage of the integrator between beginning and end of the conversion directly corresponds to the error made on the output code (underestimation in case of increase of integrator, overestimation in case of decrease of the integrator). Thus by quantifying the output voltage of the integrator with an auxiliary ADC before and after a conversion, it is possible to refine the result of the conversion.

Figure 9:
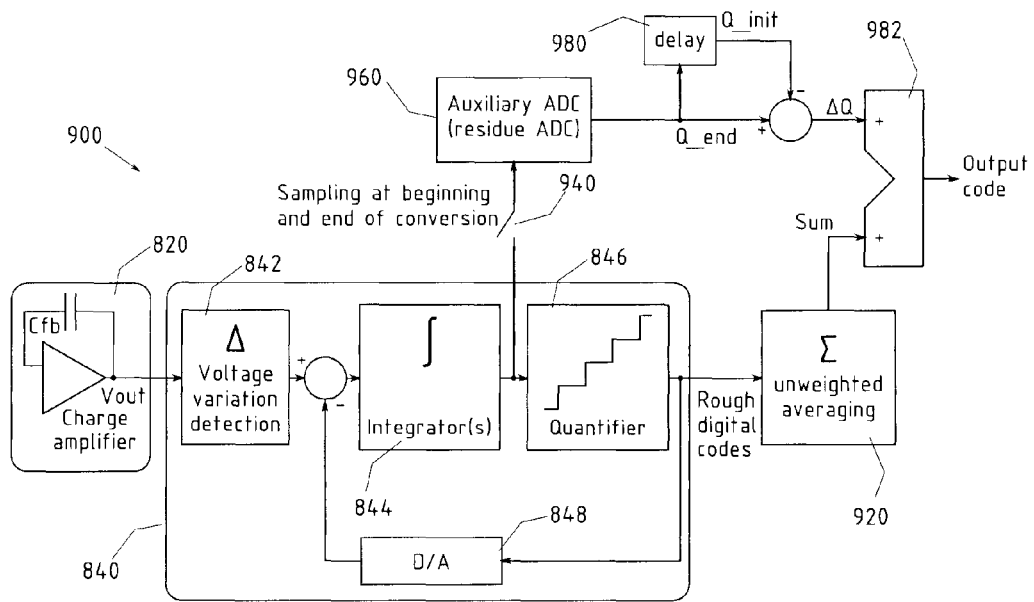
FIG. 9 represents an acquisition chain with sigma delta ADC with residue quantification at beginning and end of conversion in order to extend the resolution.

The precision of the final result can theoretically be increased arbitrarily, by selecting an auxiliary ADC with sufficient resolution. This solution is depicted in connection with the block diagram of FIG. 9. In FIG. 9 an acquisition chain 900 with sigma delta ADC with residue quantification at beginning and end of conversion, in order to extend the resolution, is represented. The elements indicated with prefix 8 have already been identified in connection with FIG. 8 described above. In addition, the block diagram of FIG. 9 comprises an averaging element 920, a switch 940 that allows sampling at the beginning and at the end of the conversion, an auxiliary analog to digital converter 960, a delay 980 and an output block 982.

The output codes from the quantifier 846 are averaged by the block 920, performing the un-weighted averaging, which generates the signal labelled "sum". The output of the integrator 844 is sampled and quantified before and after each conversion by the auxiliary ADC 960, called also residue ADC, in order to provided two output codes named Q_init (code corresponding to the initial value of the integrator and stored into a delay element or register) and Q_end (code corresponding to the final value of the integrator, at the end of the conversion. The difference Q_end−Q_init is then calculated digitally, providing a result DeltaQ (code corresponding to the variation of the integrator between beginning and end of the conversion). This code is then added to the signal sum with appropriate weight in block 982 in order to correct for the under or over estimation of the sum code, and to provide a high resolution output code.

Another solution consists in resetting the integrator at the beginning of each conversion. In this case, as the initial state is known, it does not need to be quantified, as the reset voltage may be selected in such a way to correspond to a well-defined code, typically 0, anyway a defined value. Therefore, only the final voltage at the end of the conversion needs to be quantified.

Figure 10:
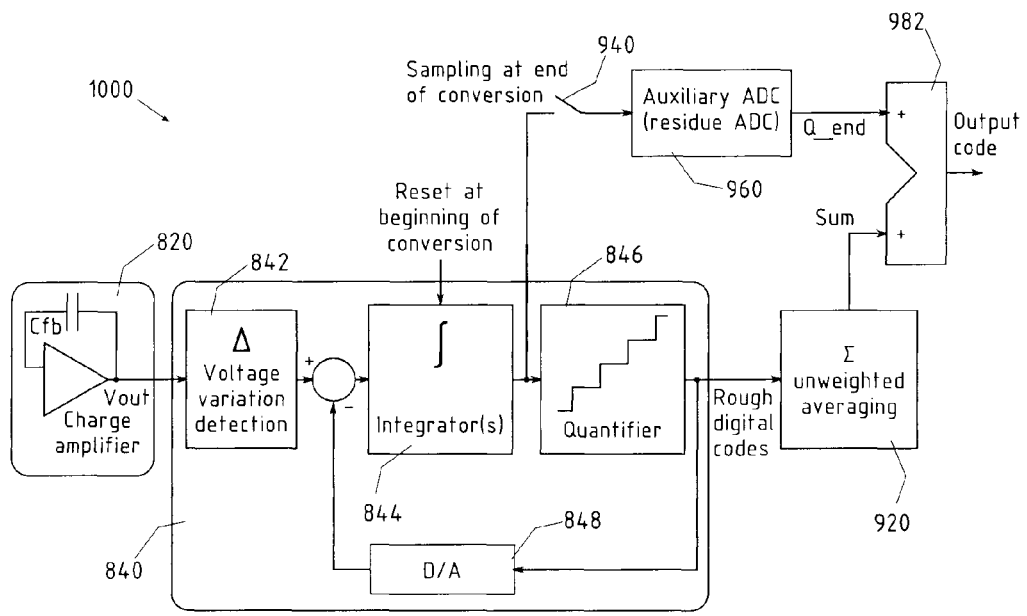
FIG. 10 represents an acquisition chain with an incremental ADC with reset of integrator at beginning of conversion and residue quantification at end of conversion in order to extend the resolution.

This situation is depicted in FIG. 10, that is a block representation of an acquisition chain with an incremental ADC with reset of integrator at beginning of conversion and residue quantification at end of conversion in order to extend the resolution. In FIG. 10 the represented acquisition chain 1000 comprises elements indicated with prefix 8 that have already been identified in connection with FIG. 8 described above. In addition, the block diagram of FIG. 10 comprises an averaging element 920, a switch 940 that allows sampling at the end of the conversion, an auxiliary analog to digital converter 960, and an output block 982.

Figure 5:
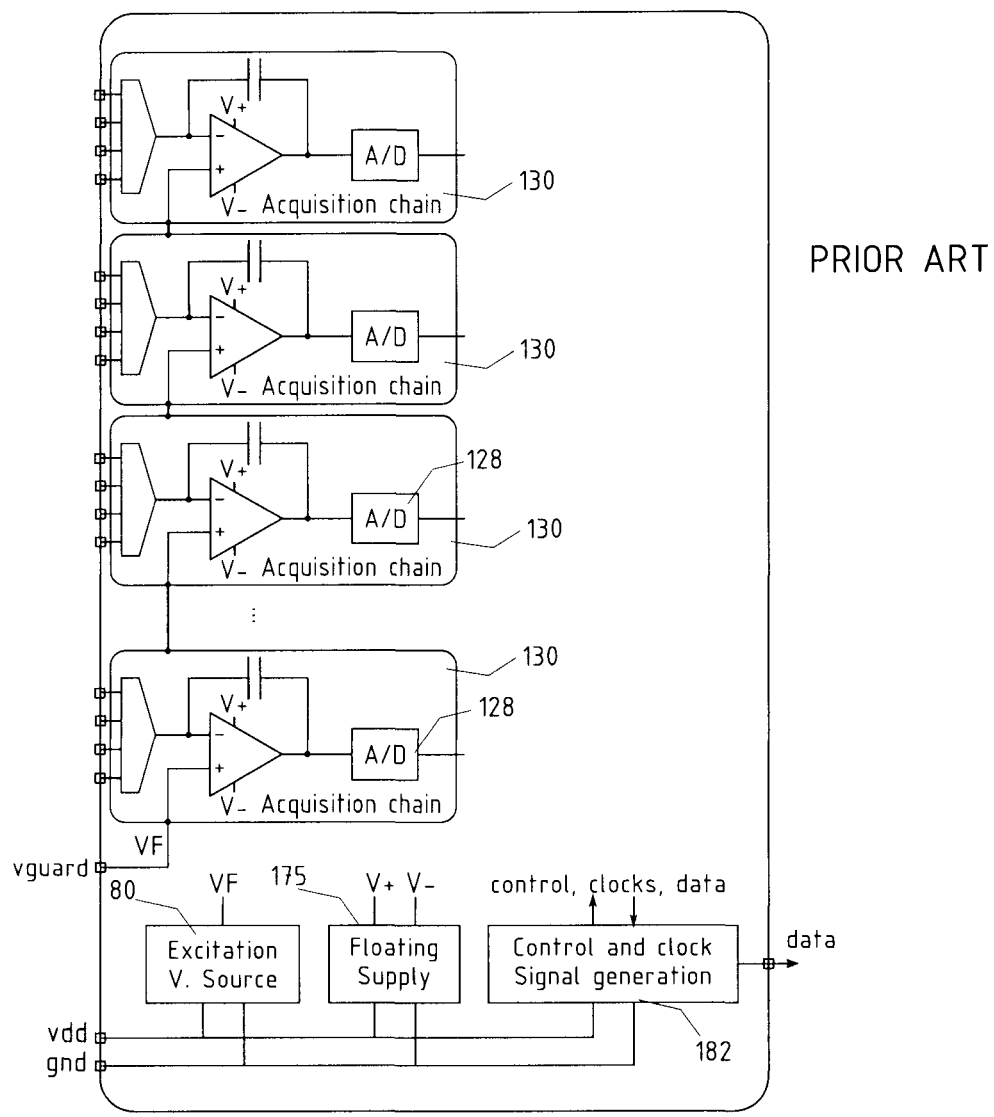
FIG. 5 illustrates in block representation of the circuitry of FIG. 4.
Figure 11:
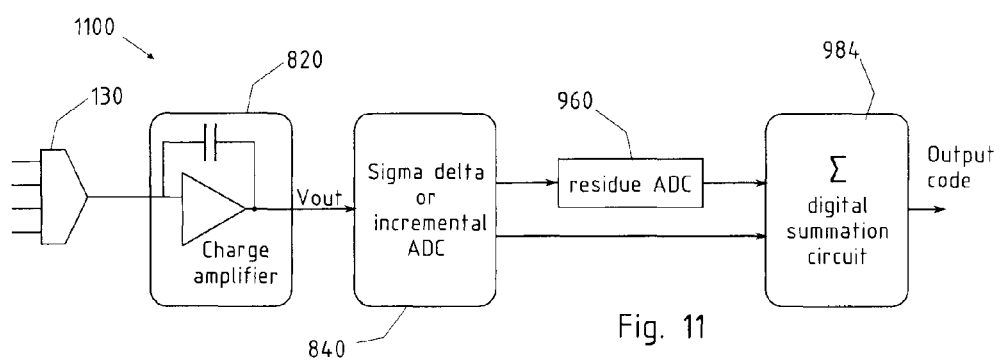
FIG. 11 represents an acquisition chain with input multiplexer, charge amplifier, sigma delta or incremental ADC, residue ADC and digital summation circuitry.

With the reset of the integrator, the sigma delta modulator 840 becomes an incremental ADC. The integrator 844 of the sigma delta modulator 840 indicates by how much the output code from the sigma delta loop is underestimated or overestimated, and is thus an image of the residual conversion error. For this reason it is referred to as residue, and the ADC sampling it or auxiliary ADC is referred to as residue ADC 960. Thus, considering FIG. 9 or 10 with auxiliary ADC 960, each acquisition chain of the measurement circuit shown in FIG. 5 may comprise an analog input multiplexer to select between several electrodes to be monitored, a charge amplifier, a sigma delta or incremental ADC, a residue ADC used to periodically evaluate the output of the integrator of the sigma delta or incremental, and digital summation circuitry in order to combine the result of the sigma delta or incremental ADC (sum signal) with the results from the residue ADC, in order to extend the resolution. This combination is illustrated in FIG. 11 that illustrates an acquisition chain with input multiplexer, charge amplifier, sigma delta or incremental ADC, residue ADC and digital summation circuitry.

Figure 12:
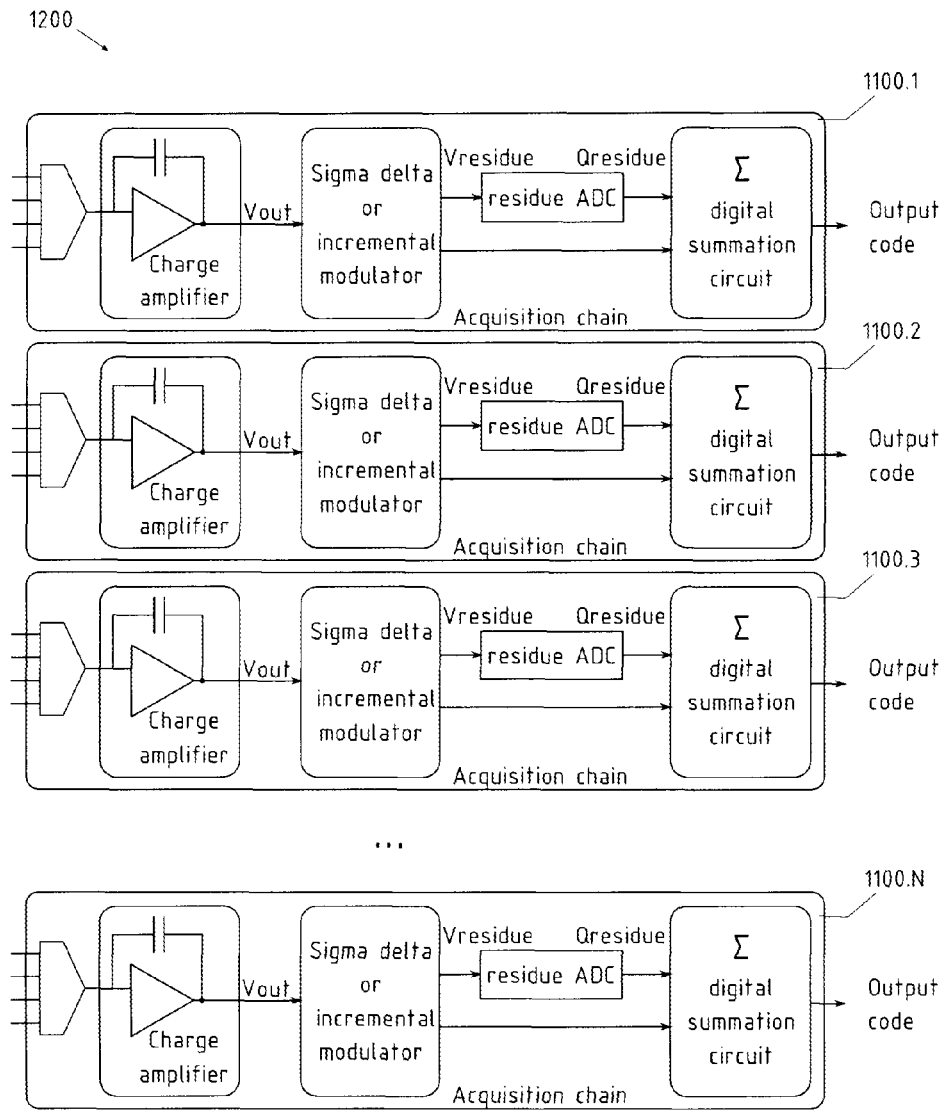
FIG. 12 represents a measurement circuit with several acquisition chains with input multiplexer, charge amplifier, sigma delta or incremental ADC, residue ADC and digital summation circuitry.

FIG. 12 illustrates a measurement circuit with several acquisition chains with input multiplexer, charge amplifier, sigma delta or incremental ADC, residue ADC and digital summation circuitry.

In both FIGS. 11 and 12, all the represented elements are identified by corresponding reference numerals that are explained in detail in connection with previous figures.

Theoretically the maximum number N of modulation cycles that can be averaged for each conversion is equal to $$fmod/(frame\_rate*N\_input\_mux)$$

with:
fmod being the modulation rate,
frame_rate the frame rate at which all the electrodes must be scanned, and
N_input_mux the number of input electrodes to be scanned by the input multiplexer.

However, practically the achievable modulation rate is limited, typically due to parasitic resistances and capacitances and speed constraints.

Let us assume for instance that fmod is limited to 8 kHz, and that we want to achieve a frame rate of 125 Hz. This corresponds to 8 kHZ/125 Hz=64 modulation cycles per frame period. Assuming that each input multiplexer has to scan successively N_input_mux=8 inputs, this means that maximum 8 modulation cycles could be averaged per conversion.

However, some time is also lost after switching of the multiplexer in order to reinitialize the A/D for the new conversion, and at the end of the conversion, to transfer the residue to the residue ADC. Assuming for instance that this time lost corresponds to 4 modulation cycles (2 at the beginning of the conversion and two at the end), this means that only 4 modulation cycles could still be averaged per conversion, which is a very low number. Thus only a very limited number of bits (typically 2 or 3 bits) could be extracted from the first ADC (sigma delta or incremental ADC), so that all the remaining resolution (typically 13 or 14 bits) must be recovered by the residue ADC. The limited number of averaged modulation cycles thus sets high constraints on the resolution of the residue ADC, leading to a large silicon area for the residue ADC.

The other drawback of having such a low number of averaged modulation cycles is that the noise is not strongly attenuated. The thermal noise power is divided by the number of averaged modulation cycles, thus it is desirable to average over an as large as possible number of modulation cycles. Poor attenuation is also obtained for external perturbation, due to the small number of averaged modulation cycles. In particular, for instance by assuming an input multiplexing by 8, this means that each electrode is measured during a time corresponding to maximum ⅛ of the frame period. Hence the bandwidth of the filter for the perturbation is at least of the order of 8 times the frame rate. The bandwidth for the noise and the perturbations is thus directly proportional to the number N_input_mux of multiplexed input electrodes. Thus the higher the number of multiplexed input electrodes, the worse the rejection of external perturbations will be.

These problems could be strongly alleviated by reducing the number N_input_mux of multiplexed inputs, or at the extreme, by suppressing completely the input multiplexer (corresponding to N_input_mux=1). However, this would lead to a very large area, as a much larger number of full ADC's (sigma delta or incremental ADC plus residue ADC) would be required, at the extreme one per input electrode if the input multiplexer is suppressed.

Figure 13:
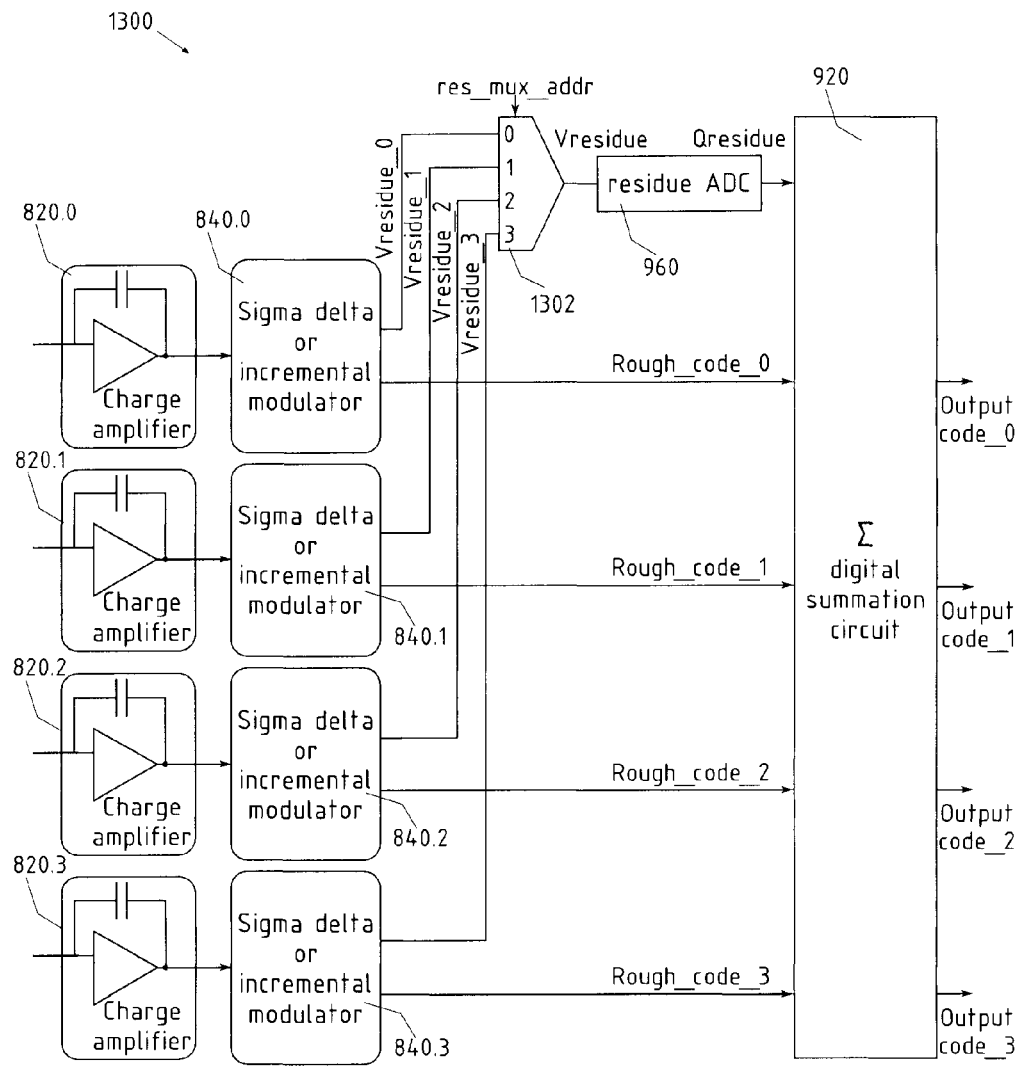
FIG. 13 represents a channel addressing 4 input electrodes, with a charge amplifier and incremental or sigma delta ADC per electrode and a multiplexed residue ADC common to all electrodes.

In order to combine a good averaging, thus a good rejection of noise and perturbations, at a limited cost in terms of area, the present invention proposes a circuitry illustrated in FIG. 13.

In accordance with FIG. 13, it is assumed that a plurality of electrodes, not shown in the figure, are sampled, being represented in the figure only via the label inp_0, 1, 2, and 3. In the figure it is assumed that only 4 input electrodes are sampled. The number of electrodes that may be sampled is larger, 4 being elected herein only for illustrative purposes. The input electrodes are sampled in parallel. As illustrated in the figure to each electrode corresponds a separate charge amplifier 820.0, 820.1, 820.2 and 820.3 and a separate modulator 840.0, 840.1, 840.2, and 840.3. The modulators 840 may be sigma delta modulators or incremental modulators. The charge amplifier 820.*n* and the modulator 840.*n* receive the input signal and output a residue signal and a rough code corresponding to the residue signal. The plurality of residue signals outputted by each modulator 840 is fed to a multiplexer 1302 that multiplexes all the received signals and outputs a multiplexed residue signal. The multiplexed residue signal is fed into a residue analog to digital converter 960 that generates a digitized residue signal. The digitized residue signal is then fed into a digital summation circuitry 920. The plurality of rough codes corresponding to the residue signal outputted by each modulator 840 is as well fed directly into the digital summation circuitry 920. The digital summation circuitry 920, based on the digitized residue signal and the plurality of rough codes received outputs a plurality of averaged output codes.

Therefore, the present invention proposes a sampling circuitry for a plurality of electrodes, comprising: a plurality of charge amplifiers and a plurality of modulators, wherein each charge amplifier and each modulator, comprised in said plurality of charge amplifiers and said plurality of modulators respectively, corresponds to an electrode of said plurality of electrodes, wherein each modulator generates a residue signal and a rough code corresponding to each sampled electrode of said plurality of electrodes, a multiplexer capable of receiving a plurality of residue signals generated by the plurality of modulators, a residue analog to digital converter capable of receiving a multiplexed residue signal from said multiplexer and outputting a digitized multiplexed residue signal, and a digital summation circuitry capable of receiving said digitized multiplexed residue signal and a plurality of rough codes, comprising each rough code corresponding to each sample electrode, and outputting a plurality of output codes.

The circuitry of FIG. 13 consists of one charge amplifier and sigma delta or incremental ADC per electrode, and moving the multiplexer in front of residue ADC, which is common for several electrodes. FIG. 13 illustrates such a channel able to sample a plurality (4 in this example) of input electrodes. Each electrode has its own dedicated charge amplifier and sigma delta or incremental ADC. Thus all the input electrodes are sampled in parallel. This increases the averaging.

Indeed assuming for instance a modulation rate of 8 kHz and a frame rate of 125 Hz, this means that 64 modulation cycles can be averaged per conversion for each electrodes, instead of 8 or 4 in the previous example. A good rejection of perturbation is thus also achieved, as all electrodes are permanently monitored, instead of being monitored during only a fraction of the frame period, as was the case with multiplexing at input of the charge amplifier and sigma delta ADC.

It may seem that the area is drastically increased because there is now one charge amplifier and one sigma delta or incremental ADC per electrode. This area increase is however not so drastic. Indeed, due to the better averaging, the noise constraints on these blocks are strongly relaxed, allowing reduction of the sizes of filtering capacitors and transistors. For instance if there are 8 charge amplifiers and 8 sigma delta or incremental ADC in parallel, 8 times more samples are averaged, so the sizes of most capacitors (except the feedback capacitors of the charge amplifiers) could be roughly reduced by 8 while keeping the same thermal noise level. And the sizes of the MOS transistors driving could be reduced accordingly.

The configuration proposed in FIG. 13 has a single residue ADC common for several electrodes. However, as more samples are averaged in the previous stage (incremental or sigma delta ADC), for instance 64 instead of 4 or 8, much more resolution is extracted already in the first ADC stage, so that the resolution required for the residue ADC is relaxed accordingly, leading to an area reduction for this block.

Notice that the residue ADC must sample the output of the integrator of a sigma delta or incremental ADC at the end of a given modulation cycle. After it has sampled the value, it may be disconnected from the integrator and perform the ADC conversion independently, for instance by successive approximation or any other principle of ADC. During the ADC conversion of the residue, the incremental or sigma delta ADC may go on acquiring new samples for the next conversion, in order to avoid loss of time. The principle is similar to a pipeline ADC where the first stage is the sigma delta or incremental ADC, and the second stage the residue ADC.

The multiplexing takes place before the residue ADC. Indeed, the residue ADC must quantify the output voltage of the integrator before and after each conversion, thus between the different conversions, thus basically once per frame per electrode, an extremely low conversion rate. If there is one residue ADC per input, and assuming a frame rate of 125 Hz, each ADC would have to perform a conversion every 8 millisecond. Assuming that the conversion can be easily performed in a few microseconds, the residue ADC would be inactive almost all the time. Hence it would be an important waste of silicon area to implement one residue ADC per electrode, as the same residue ADC can easily be reused to perform the residue quantizations for the other electrodes, by multiplexing. For instance, a multiplexing by 8 can easily be realized, as long as the conversion time of the residue ADC is less than 1 millisecond, a still very comfortable value.

As the residue must be sampled between two sigma delta or incremental ADC conversions, the phases of the frames for the different electrodes sharing a common residue ADC must be properly shifted such that the residue conversions for the different electrodes do not overlap. For instance in case of multiplexing by 8, the frames corresponding to the different electrodes should ideally be shifted by ⅛ of the frame period, thus 1 millisecond, in order to have the maximum time available for the conversion.

Figure 14:
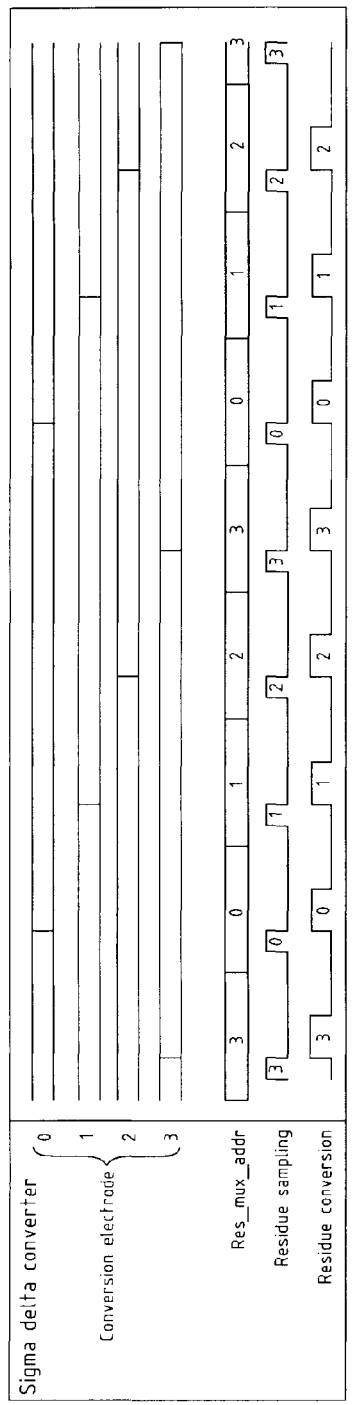
FIG. 14 represents a shift of the frames corresponding to the different electrodes, and timing of different residue ADC conversion (case of multiplexing by 4), in case of sigma delta conversion.

The shift of the frames and of the start of the conversion is illustrated in FIG. 14, in the case of a multiplexing by 4. FIG. 14 illustrates the shift of the frames corresponding to the different electrodes, and timing of different residue ADC conversion (case of multiplexing by 4), in case of sigma delta conversion.

In accordance with the figure, the first four lines show the limits of the sigma delta (or incremental) ADC conversions. The vertical separations indicate the separations between two consecutive ADC conversions. This means that each ADC conversion is realized by summing up the rough output codes generated between two vertical separations. The residue corresponding to each electrode is then sampled at the beginning and at the end of each conversion, thus in fact between each conversion. The conversion of the residue can then be performed afterwards, while the sigma delta is performing the next conversion.

As already mentioned, the summation of the output codes from the sigma delta modulator is added to a code corresponding to the voltage variation of the integrator during the conversion, thus the difference between the residue code after the conversion and before the conversion, as illustrated in FIG. 9. However, if the integrator is systematically reset before each conversion (or between two conversion), thus in the case of an incremental ADC, then only the final value at the end of the conversion should be added, as illustrated at FIG. 10, as the initial value may be assumed to be 0 or a constant value. In this case, the residue at the end of the conversion does not need to be neither memorized, nor subtracted at the end of the conversion, simplifying the design.

However, the reset of the different incremental ADC's must also be phase shifted as they must occur at the beginning of the conversions, and the conversions are phase shifts.

Figure 15:
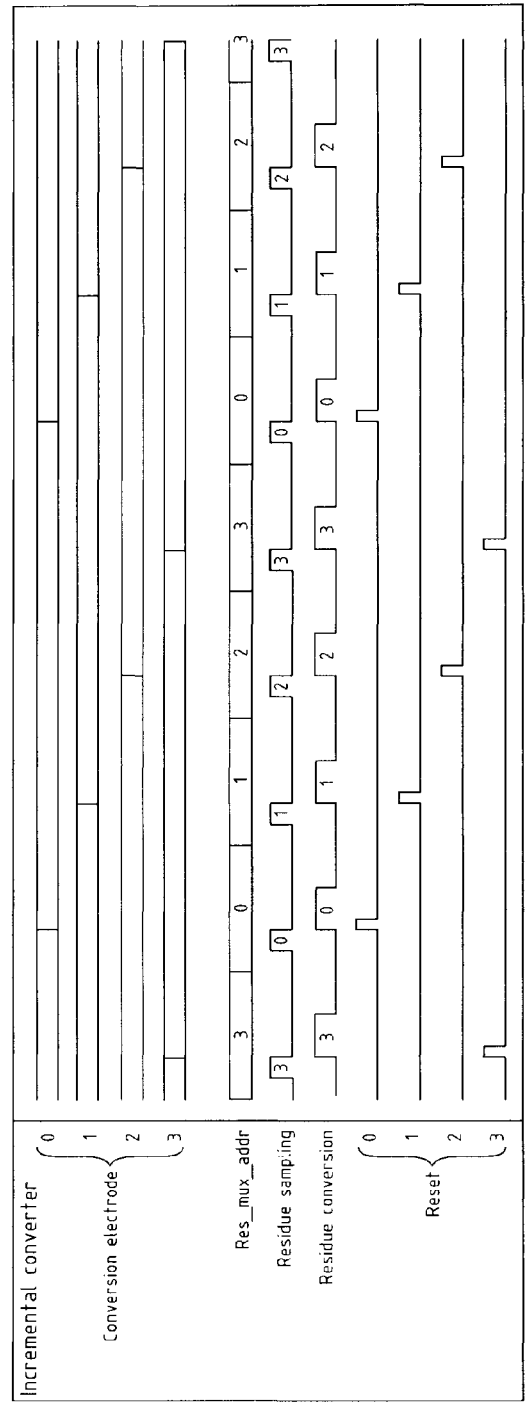
FIG. 15 represents the shift of the frames corresponding to the different electrodes, and timing of different residue ADC conversions and reset signal (case of multiplexing by 4), in case of incremental conversion.

This situation is described in FIG. 15, which is similar to FIG. 14, but shows the time at which the different incremental ADC's are reset. The resets should in fact happen directly after the sampling of the residue of the previous conversion, in order to start the next one.

FIG. 15 illustrates the shift of the frames corresponding to the different electrodes, and the timing of different residue ADC conversions and reset signal (case of multiplexing by 4), in case of incremental conversion. In case the conversion time for the residue is very short with respect to the frame period, all inputs can be acquired simultaneously, starting and stopping at the same time. In this case incremental ADC's should be used, as all the integrators should be reset simultaneously at the beginning of the conversion. At the end of the parallel acquisition, the residue ADC successively scans all the residues from the different integrators of the incremental ADC's, one after the other.

Of course a measurement circuitry can be made of a collection of several channels corresponding to FIG. 13, each channel itself comprising several charge amplifiers and sigma delta or incremental ADC's, one residue amplifier and digital summation circuitry.

Figure 16:
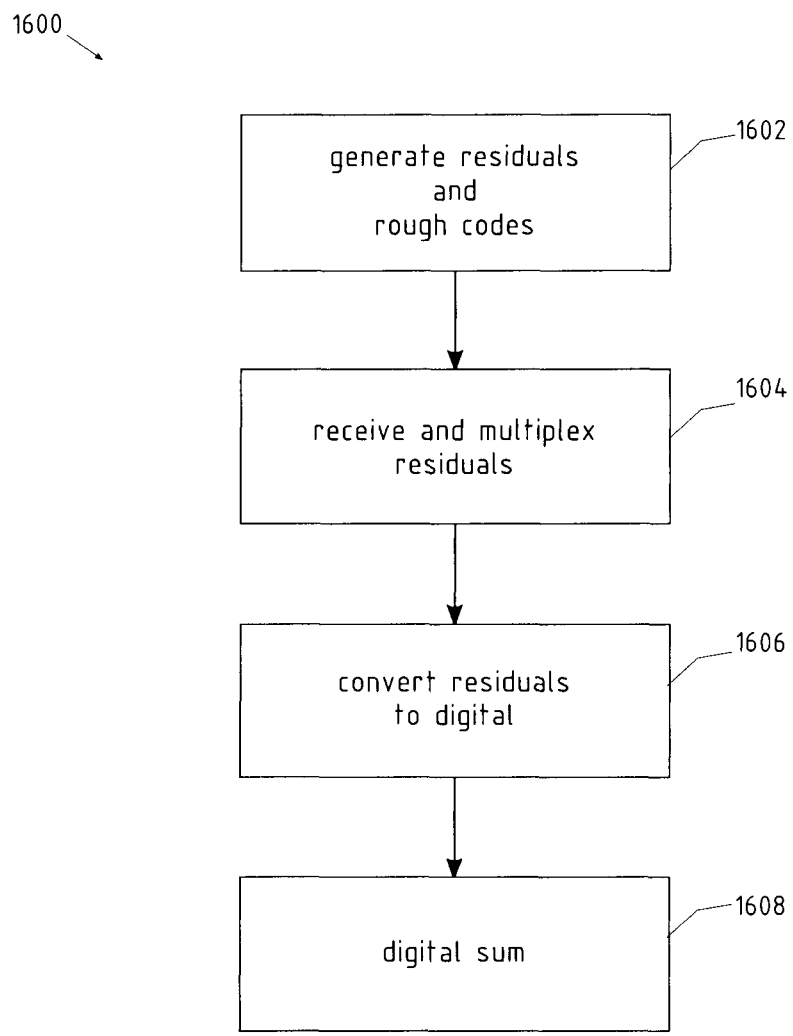
FIG. 16 is a block representation of a method in accordance with the present invention.

FIG. 16 refers to a method of sampling a plurality of electrodes, in accordance with the present invention.

As illustrated in FIG. 16 and as explained in detail in the previous paragraphs, a method 1600 of sampling a plurality of electrodes, comprises at least the steps of generating, 1602, by a plurality of modulators, a plurality of residue signals and a plurality of rough codes, each residue signal and each rough code corresponding to each sampled electrode of said plurality of electrodes. The method 1600 also comprises the step of receiving 1604, by a multiplexer, the plurality of residue signals generated by the plurality of modulators. Further, the method 1600 comprises the step of receiving 1606, by a residue analog to digital converter, a multiplexed residue signal from said multiplexer and outputting a digitized multiplexed residue signal. Further yet, the method comprises the step of receiving 1608, by digital summation circuitry, the digitized multiplexed residue signal and the plurality of rough codes, and outputting a plurality of output codes.

Therefore, in summary the present invention concerns a sampling circuitry for a plurality of electrodes, comprising a plurality of charge amplifiers and a plurality of modulators, wherein each charge amplifier and each modulator, comprised in the plurality of charge amplifiers and the plurality of modulators, respectively, corresponds to an electrode of said plurality of electrodes, wherein each modulator capable of generating a residue signal and a rough code corresponds to each sampled electrode of the plurality of electrodes, a multiplexer capable of receiving a plurality of residue signals generated by the plurality of modulators, a residue analog to digital converter capable of receiving a multiplexed residue signal from the multiplexer and outputting a digitized multiplexed residue signal, and a digital summation circuitry capable of receiving the digitized multiplexed residue signal and a plurality of rough codes, comprising each rough code corresponding to each sample electrode, and outputting a plurality of output codes.

Each electrode of the plurality of electrodes is processed separately in parallel by each charge amplifier and each modulator. The digitized multiplexed residue signal is multiplexed between a plurality of integrators comprised by the plurality of modulators. Optionally, a plurality of phases of frames corresponding to the different electrodes comprised by the plurality of electrodes are phase shifted to allow time multiplexing of the residue signals. The residue signal comprises analog signals. The plurality of modulators when resetting their included integrator become incremental analogue to digital converters, and the phase shifting occurs at the reset of the plurality of incremental analogue to digital converters. The residue signal is sampled between two modulators or two incremental ADC convertors, and the phases of frames for the different electrodes sharing a common residue ADC that must be shifted such that the residue conversions for the different electrodes do not overlap.

The present invention further concerns a method of sampling a plurality of electrodes, comprising generating, by a plurality of modulators, a plurality of residue signals and a plurality of rough codes, each residue signal and each rough code corresponding to each sampled electrode of said plurality of electrodes, receiving, by a multiplexer, the plurality of residue signals generated by the plurality of modulators, receiving, by a residue analog to digital converter, a multiplexed residue signal from the multiplexer and outputting a digitized multiplexed residue signal, and receiving, by digital summation circuitry, the digitized multiplexed residue signal and the plurality of rough codes, and outputting a plurality of output codes.

While the invention herein disclosed has been described by means of specific embodiments, examples and applications thereof, numerous modifications and variations could be made thereto by those skilled in the art without departing from the scope of the invention set forth in the claims.

| Legend: |
| --- |
| 20 input capacitor to be detected |
| 25 capacitive sense electrodes |
| 30 guard |
| 80 varying voltage |
| 85 floating potential |
| 120 measurement circuitry |
| 126 multiplexer |
| 127 charge amplifier |
| 128 ADC |
| 130 acquisition chains |
| 150 Chip |
| 170 floating domain |
| 175 floating supply & ground |
| 182 control and clock signals |
| 200 LCD, capacitive touch-sensitive array |
| 210 parasitic capacitances |
| 212 guard capacitances |
| 620 charge amplifier |
| 640 means for analog averaging, |
| 660 means for analog to digital conversion |
| 720 charge amplifier |
| 740 analog to digital converter |
| 760 means for digital averaging |
| 820 charge amplifier |
| 840 sigma delta modulator |
| 842 voltage variation detection block |
| 844 integrator |
| 846 quantifier |
| 848 digital to analog converter |
| 860 digital low pass filter |
| 900 acquisition chain |
| 920 averaging element |
| 940 switch |
| 960 auxiliary analog to digital converter |
| 980 delay |
| 982 output block |
| 1000 acquisition chain |
| 1302 multiplexer |
| 1600 method of sampling a plurality of electrodes |
| 1602 the step of generating by a plurality of modulators, a plurality of residue signals and a plurality of rough codes |

-continued

Legend:

| | |
|---|---|
| 1604 | the step of receiving by a multiplexer, the plurality of residue signals generated by the plurality of modulators |
| 1606 | the step of receiving by a residue analog to digital converter a multiplexed residue signal |
| 1608 | the step of receiving the digitized multiplexed residue signal and the plurality of rough codes |

The invention claimed is:

1. A sampling circuitry for a plurality of electrodes, comprising:
a plurality of charge amplifiers and a plurality of modulators,
wherein each charge amplifier and each modulator, comprised in said plurality of charge amplifiers and said plurality of modulators, respectively, corresponds to an electrode of said plurality of electrodes,
wherein each modulator is capable of generating a residue signal and a rough code corresponding to each sampled electrode of said plurality of electrodes,
a multiplexer capable of receiving a plurality of residue signals generated by the plurality of modulators,
a residue analog to digital converter capable of receiving a multiplexed residue signal from said multiplexer and outputting a digitized multiplexed residue signal, and
a digital summation circuitry capable of receiving said digitized multiplexed residue signal and a plurality of rough codes, comprising each rough code corresponding to each sample electrode, and outputting a plurality of output codes.

2. The sampling circuitry of claim 1, wherein each electrode of said plurality of electrodes is processed separately in parallel by said each charge amplifier and said each modulator.

3. The sampling circuitry of claim 1, wherein said digitized multiplexed residue signal is multiplexed between a plurality of integrators comprised by said plurality of modulators.

4. The sampling circuitry of claim 1, wherein a plurality of phases of frames corresponding to the different electrodes comprised by said plurality of electrodes are phase shifted to facilitate time multiplexing of the residue signals.

5. The sampling circuitry of claim 4, wherein said residue signal comprising analog signals.

6. The sampling circuitry of claim 4, wherein said plurality of modulators when resetting their included integrator become incremental analogue to digital converters, and
wherein said phase shifting occurs at the reset of the plurality of incremental analogue to digital converters.

7. The sampling circuitry of claim 6, wherein the residue signal is sampled between two modulators or two incremental ADC convertors, and
wherein phases of frames for the different electrodes sharing a common residue ADC must be shifted such that the residue conversions for the different electrodes do not overlap.

8. A method of sampling a plurality of electrodes, comprising:
generating, by a plurality of modulators, a plurality of residue signals and a plurality of rough codes, each residue signal and each rough code corresponding to each sampled electrode of said plurality of electrodes,
receiving, by a multiplexer, the plurality of residue signals generated by the plurality of modulators,
receiving, by a residue analog to digital converter, a multiplexed residue signal from said multiplexer and outputting a digitized multiplexed residue signal, and
receiving, by digital summation circuitry, said digitized multiplexed residue signal and the plurality of rough codes, and outputting a plurality of output codes.

9. The method of claim 8, wherein each electrode of said plurality of electrodes is processed separately in parallel by said each charge amplifier and said each modulator.

10. The method of claim 8, wherein said digitized multiplexed residue signal is multiplexed between a plurality of integrators comprised by said plurality of modulators.

11. The method of claim 8, wherein a plurality of phases of frames corresponding to the different electrodes comprised by said plurality of electrodes are phase shifted to allow time multiplexing of the residue signals.

12. The method of claim 11, wherein said residue signal comprising analog signals.

13. The method of claim 11, wherein said plurality of modulators when resetting their included integrator become incremental analogue to digital converters, and
wherein said phase shifting occurs at the reset of the plurality of incremental analogue to digital converters.

14. The method of claim 8, wherein the residue signal is sampled between two modulators or two incremental ADC convertors, and
wherein phases of frames for the different electrodes sharing a common residue ADC must be shifted such that the residue conversions for the different electrodes do not overlap.

* * * * *